United States Patent
Tseng et al.

(10) Patent No.: US 10,219,366 B1
(45) Date of Patent: Feb. 26, 2019

(54) MULTILAYER PRINTED CIRCUIT BOARD CAPABLE OF REDUCING TRANSMISSION LOSS OF HIGH SPEED SIGNALS

(71) Applicants: Inventec (Pudong) Technology Corp., Shanghai (CN); Inventec Corporation, Taipei (TW)

(72) Inventors: Chun-I Tseng, Taipei (TW); Mu-Chih Chuang, Taipei (TW); Wei-Fan Ting, Taipei (TW); Yen-Hao Chen, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 15/863,996

(22) Filed: Jan. 8, 2018

(30) Foreign Application Priority Data

Nov. 17, 2017 (CN) .......................... 2017 1 1141892

(51) Int. Cl.
| | |
|---|---|
| *H05K 1/02* | (2006.01) |
| *H05K 3/10* | (2006.01) |
| *H05K 3/40* | (2006.01) |
| *H05K 1/11* | (2006.01) |

(52) U.S. Cl.
CPC ......... *H05K 1/0237* (2013.01); *H05K 1/0298* (2013.01); *H05K 1/115* (2013.01); *H05K 3/10* (2013.01); *H05K 3/4038* (2013.01); *H05K 2201/09227* (2013.01)

(58) Field of Classification Search
CPC ... H05K 1/00; H05K 1/02; H05K 1/11; H05K 1/18; H05K 3/00; H01L 21/46; H01L 21/48; H01L 21/50; H01L 23/12; H01L 23/498

USPC ........ 174/262, 255–258, 261; 361/760, 761; 257/700, 737, 777; 438/113, 758
See application file for complete search history.

(56) References Cited

U.S. PATENT DOCUMENTS

| | | | | |
|---|---|---|---|---|
| 5,943,212 | A * | 8/1999 | Horiuchi ........... | H01L 23/49816 174/252 |
| 6,630,630 | B1 * | 10/2003 | Maezawa ............ | H05K 3/4069 174/255 |
| 8,975,742 | B2 * | 3/2015 | Furutani .......... | H01L 23/49838 257/700 |
| 2002/0172021 | A1 * | 11/2002 | Seri .................... | H01L 23/49894 361/760 |
| 2002/0184757 | A1 * | 12/2002 | Lee ...................... | H05K 3/0094 29/852 |
| 2007/0218589 | A1 * | 9/2007 | Machida ............. | H05K 3/4614 438/113 |

(Continued)

*Primary Examiner* — Xiaoliang Chen
(74) *Attorney, Agent, or Firm* — Winston Hsu

(57) ABSTRACT

A multilayer printed circuit board includes an inner circuit layer, a first outer circuit layer, a second outer circuit layer, a via, and a layer of high dielectric dissipation solder resist ink. The first outer circuit layer includes a first trace for transmitting a high frequency signal. The inner circuit layer includes a second trace, and is formed between the first outer circuit layer and the second outer circuit layer. The via is formed from the first outer circuit layer to the second outer circuit layer, and is coupled to the first trace and the second trace. The second trace is coupled to the first trace through the via for transmitting the high frequency signal. The layer of high dielectric dissipation solder resist ink is formed on a terminal of the open stub of the via exposed outside of the second outer circuit layer.

4 Claims, 2 Drawing Sheets

(56) References Cited

U.S. PATENT DOCUMENTS

| | | | | |
|---|---|---|---|---|
| 2009/0183910 A1* | 7/2009 | Sunohara | H01L 23/13 | 174/266 |
| 2009/0229868 A1* | 9/2009 | Tsukada | H05K 3/4661 | 174/258 |
| 2009/0236128 A1* | 9/2009 | Tsukada | H05K 3/386 | 174/256 |
| 2009/0236130 A1* | 9/2009 | Mok | H05K 3/4608 | 174/257 |
| 2009/0236131 A1* | 9/2009 | Mok | H05K 3/1258 | 174/257 |
| 2009/0273097 A1* | 11/2009 | Hedler | H01L 22/32 | 257/778 |
| 2010/0139969 A1* | 6/2010 | An | H05K 3/4007 | 174/266 |
| 2010/0140800 A1* | 6/2010 | Hagihara | H01L 21/563 | 257/737 |
| 2010/0147560 A1* | 6/2010 | Kaneko | H01L 23/13 | 174/250 |
| 2011/0000706 A1* | 1/2011 | Shomura | H05K 3/4602 | 174/262 |
| 2011/0024172 A1* | 2/2011 | Maruyama | H01L 23/49822 | 174/258 |
| 2011/0031606 A1* | 2/2011 | Chen | H01L 23/3121 | 257/690 |
| 2011/0304016 A1* | 12/2011 | Nakamura | H01L 21/4857 | 257/532 |
| 2012/0199386 A1* | 8/2012 | Adachi | H05K 3/445 | 174/258 |
| 2012/0261166 A1* | 10/2012 | Oh | H05K 1/0206 | 174/252 |
| 2013/0140692 A1* | 6/2013 | Kaneko | H05K 1/111 | 257/737 |
| 2014/0144686 A1* | 5/2014 | Shimizu | H05K 1/185 | 174/258 |
| 2014/0146500 A1* | 5/2014 | Shimizu | H05K 1/185 | 361/761 |
| 2014/0182892 A1* | 7/2014 | Hsu | H05K 1/186 | 174/251 |
| 2014/0182915 A1* | 7/2014 | Han | H05K 3/0017 | 174/262 |
| 2014/0353026 A1* | 12/2014 | Hattori | H01L 24/81 | 174/262 |
| 2015/0179560 A1* | 6/2015 | Arisaka | H05K 1/0366 | 257/777 |
| 2015/0245484 A1* | 8/2015 | Ryu | H05K 1/0271 | 174/262 |
| 2015/0334842 A1* | 11/2015 | Shimabe | H01L 23/50 | 174/258 |
| 2015/0334844 A1* | 11/2015 | Shimabe | H05K 1/032 | 361/761 |
| 2016/0037630 A1* | 2/2016 | Okamoto | H05K 3/4602 | 361/760 |
| 2016/0172287 A1* | 6/2016 | Arisaka | H05K 1/11 | 257/774 |
| 2016/0316561 A1* | 10/2016 | Nam | H05K 1/113 | |
| 2017/0179013 A1* | 6/2017 | Kunimoto | H01L 21/4857 | |
| 2018/0061765 A1* | 3/2018 | Gozu | H01L 23/5383 | |

* cited by examiner

MULTILAYER PRINTED CIRCUIT BOARD CAPABLE OF REDUCING TRANSMISSION LOSS OF HIGH SPEED SIGNALS

BACKGROUND OF THE INVENTION

1. Field of the Invention

This invention is related to a multilayer printed circuit board, and more particularly, is related to a multilayer printed circuit board capable of reducing transmission loss of high speed signals.

2. Description of the Prior Art

In prior art, the multilayer printed circuit board usually uses via to connect traces between different layers. Generally, the via may be a through hole via, blind hole via, or buried hole via. Among different types of vias, the blind hole via and buried hole via are hardly used in practical due to their high cost. Therefore, the vias are commonly implemented with through holes. In this case, if the trace to be connected is a stripline, that is, the trace is disposed in an inner circuit layer of the multilayer printed circuit board, then the via will leave an open via stub. However, the resonance of the open via stub can cause significant transmission loss on high speed signals.

To reduce transmission loss caused by the open via stub, the prior art usually uses back-drilling techniques, that is, during the manufacturing process of the multilayer printed circuit board, the mechanical drill may drill the via bottom up to remove the open via stub of the via. However, the back-drilling process will complicate the manufacturing process. Nevertheless, the mechanical tolerance of the back drill will limit the drilling depth of the back drill, so the back drill cannot be applied to the high circuit density area (e.g. the area under the central processing unit) and the open via stub cannot be removed completely, leaving the issue of transmission loss for high speed signals unresolved.

SUMMARY OF THE INVENTION

One embodiment of the present invention discloses a multilayer printed circuit board. The multilayer printed circuit board includes a first outer circuit layer, an inner circuit layer, a second outer circuit layer, a via, and a layer of high dielectric dissipation solder resist ink.

The first outer circuit layer includes a first trace for transmitting a high frequency signal. The inner circuit layer includes a second trace, wherein the first outer circuit layer is formed at one side of the inner circuit layer. The second outer circuit layer is formed at another side of the inner circuit layer. The via is formed from the first outer circuit layer to the second outer circuit layer, and is coupled to the first trace and the second trace. The second trace is coupled to the first trace through the via for transmitting the high frequency signal. The layer of high dielectric dissipation solder resist ink is formed on a terminal of an open stub of the via exposed outside of the second outer circuit layer.

Another embodiment of the present invention discloses a method for producing a multilayer printed circuit board, the method includes forming a first outer circuit layer comprising a first trace, forming an inner circuit layer comprising a second trace, forming a second outer circuit layer, forming a via from the first outer circuit layer to the second outer circuit layer and coupled to the first trace and the second trace, and forming a layer of high dielectric dissipation solder resist ink on a terminal of an open stub of the via exposed outside of the second outer circuit layer. The inner circuit layer is formed between the first outer circuit layer and the second outer circuit layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
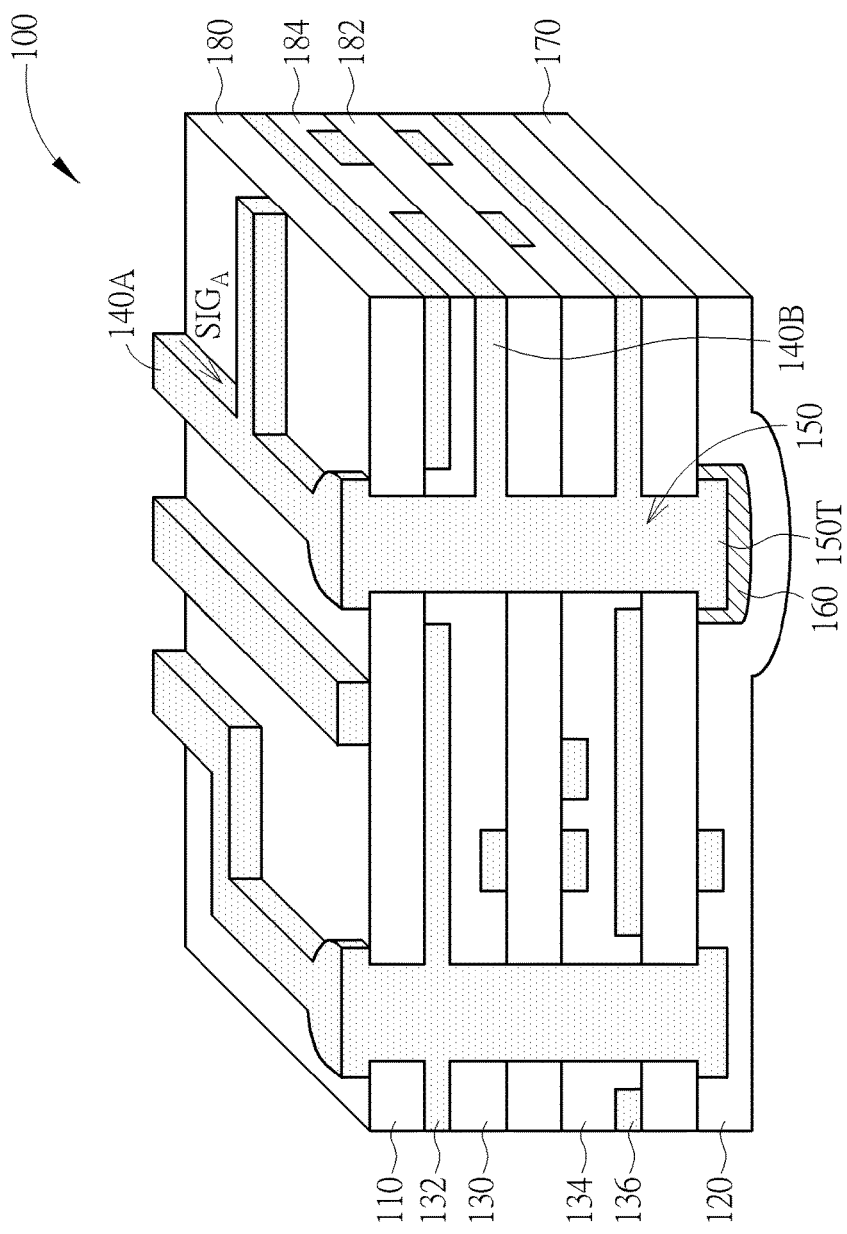
FIG. 1 shows a multilayer printed circuit board according to one embodiment of the present invention.

FIG. 1 shows a multilayer printed circuit board 100 according to one embodiment of the present invention. The multilayer printed circuit board 100 includes a first outer circuit layer 110, a second outer circuit layer 120, an inner circuit layer 130, a first trace 140A, a second trace 140B, a via 150, and a layer of high dielectric dissipation solder resist ink 160.

The first outer circuit layer 110 can be formed at one side of the inner circuit layer 130, and the second outer circuit layer 120 can be formed at another side of the inner circuit layer 130. In some embodiments, the first outer circuit layer 110 can, for example, be an outer circuit layer for coupling to external elements, and the second outer circuit layer 120 can, for example, be an outer circuit layer for soldering to the main circuit board or the outer circuit layer of other circuits. However, the objects coupled to the first outer circuit layer 110 and the second outer circuit layer 120 are not limited by the present invention.

In addition, in FIG. 1, the multilayer printed circuit board 100 can further include the inner circuit layer 132, 134, and 136, where the inner circuit layer 132 can be, for example, a power layer, while the inner circuit layer 136 can be, for example, a ground layer. That is, the multilayer printed circuit board 100 can be a six-layer PCB, however, this is not to limit the scope of the present invention. In other embodiments, the multilayer printed circuit board 100 can include even more circuit layers, and the inner circuit layer 130 can be formed in other positions between the first outer circuit layer 110 and the second outer circuit layer 120.

In the multilayer printed circuit board 100, the circuit layer can be formed on the core board, for example, the first outer circuit layer 110 and the inner circuit layer 132 can be formed on two sides of the core board 180. Also, the circuit layers formed on different core boards can be bound by a dielectric layer or a pre-impregnated (prepreg) layer. However, this is not to limit the scope of the present invention. In other embodiments of the present invention, the user can also use other materials or other processes to manufacture the multilayer printed circuit board 100.

The first outer circuit layer 110 can include a first trace 140A, and the first trace 140A can transmit a high frequency signal $SIG_A$. The inner circuit layer 130 can include a second trace 140B. The via 150 can be formed with a through hole, and can be formed from the first outer circuit layer 110 to the second outer circuit layer 120, and coupled to the first trace 140A and the second trace 140B. That is, the second trace 140B can be coupled to the first trace 140A through the via 150 for transmitting the high frequency signal $SIG_A$.

In the present embodiment, the via 150 is not coupled to other traces except the first trace 140A and the second trace 140B; therefore, the section of the via 150 exposed outside from the inner circuit layer 130 to the second outer circuit layer 120 can be seen as the open via stub of the via 150.

To prevent the high frequency signals from rebounding to the first trace 140A and the second trace 140B after entering the open via stub and lowering the quality of signal transmission, the multilayer printed circuit board 100 can form a layer of high dielectric dissipation solder resist ink 160 on a terminal of an open stub 150T of the via 150 exposed outside of the second outer circuit layer 130. Due to the high dissipation characteristics of the layer of high dielectric dissipation solder resist ink 160, the rebounding of the high frequency signal $SIG_A$ can be reduced, improving the transmission quality of high frequency signals without using back drill.

However, to avoid other traces in the second outer circuit layer 120 from contacting the layer of high dielectric dissipation solder resist ink 160 and lowering the signal quality, the multilayer printed circuit board 100 in FIG. 1 can further include a layer of low dielectric dissipation solder resist ink 170. The layer of low dielectric dissipation solder resist ink 170 can cover the second outer circuit layer 120 and the layer of high dielectric dissipation solder resist ink 160 for protecting the traces in the second outer circuit layer 120.

In some embodiments, the layer of low dielectric dissipation solder resist ink 170 can, for example, be the common solder resist ink called green solder mask. However, corresponding to a high frequency, the dissipation factor (Df) of the layer of high dielectric dissipation solder resist ink 160 would be much greater than the dissipation factor of the layer of low dielectric dissipation solder resist ink 170, the difference between these two can be over one hundred times. For example, generally, the dissipation factor corresponding to 10 GHz signals for the layer of low dielectric dissipation solder resist ink 170 may be smaller than 0.03, but the dissipation factor corresponding to 10 GHz signals for the layer of high dielectric dissipation solder resist ink 160 can be greater than 3.

Also, generally, dielectric constant (Dk) of the dissipation factor corresponding to 10 GHz signals for the layer of low dielectric dissipation solder resist ink 170 may be in the range between 3.5 and 4.5, but the dielectric constant corresponding to 10 GHz signals for the layer of high dielectric dissipation solder resist ink 160 can be greater 100.

In FIG. 1, the thickness of the layer of high dielectric dissipation solder resist ink 160 is similar to the thickness of the layer of low dielectric dissipation solder resist ink 170; both can be 1 to 2 mils. However, in other embodiments, to fully take the advantage of the layer of high dielectric dissipation solder resist ink 160 and to reduce the rebounding of high frequency signals, the thickness of the layer of high dielectric dissipation solder resist ink 160 can be increased. For example, the thickness of the layer of high dielectric dissipation solder resist ink 160 can be greater than 3 mils, however, this is not to limit the scope of the present invention.

Figure 2:
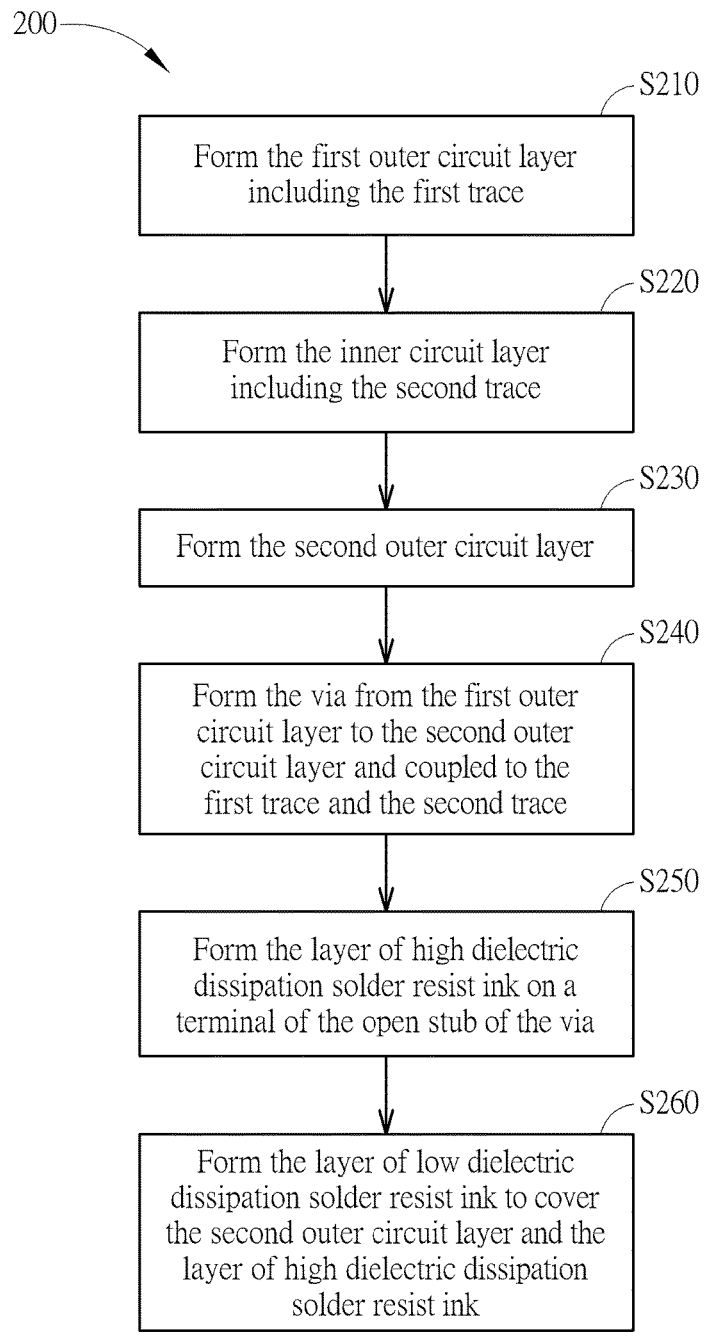
FIG. 2 shows a flow chart of a method for producing the multilayer printed circuit board in FIG. 1.

FIG. 2 shows a flow chart of a method 200 for producing the multilayer printed circuit board 100. The method 200 includes steps S210 to S260, but is not limited to the order below.

S210: forming the first outer circuit layer 110 including the first trace 140A;

S220: forming the inner circuit layer 130 including the second trace 140B;

S230: forming the second outer circuit layer 120, wherein the inner circuit layer 130 is formed between the first outer circuit layer 110 and the second outer circuit layer 120;

S240: forming the via 150 from the first outer circuit layer 110 to the second outer circuit layer 120 and coupled to the first trace 140A and the second trace 140B;

S250: forming the layer of high dielectric dissipation solder resist ink 160 on a terminal of the open stub 150T of the via 150 exposed outside of the second outer circuit layer 120; and S260: forming the layer of low dielectric dissipation solder resist ink 170 to cover the second outer circuit layer 120 and the layer of high dielectric dissipation solder resist ink 160.

In step S210, the method 200 can, for example, sputter conductive materials, such as copper foil, on the core board, and use the lithographic etching process to form the traces required by the first outer circuit layer 110, e.g. the first trace 140A. Steps S220 and S230 can be performed with similar processes. In addition, in some embodiments, the method 200 may further include steps to bind the circuit layers on different internal core boards with pre-impregnated (prepreg) layers.

In step S250, the user can apply the layer of high dielectric dissipation solder resist ink 160 on the required position with masks, that is, apply the layer of high dielectric dissipation solder resist ink 160 on the terminal of the open stub 150T of the via 150 exposed outside of the second outer circuit layer 120. In step S260, the layer of low dielectric dissipation solder resist ink 170 is formed on the second outer circuit layer 120 and the layer of high dielectric dissipation solder resist ink 160.

The method 200 can be used to produce the multilayer printed circuit board 100, and form the layer of high dielectric dissipation solder resist ink 160 on the terminal of the open stub 150T of the via 150, so the situations like the high frequency signal $SIG_A$ rebounding to the first trace 140A and 140B after entering the open stub 150T of the via 150 can be reduced, improving the transmission quality of the high frequency signals on the first trace 140A and the second trace 140B.

In summary, the multilayer printed circuit board and the method for producing the multilayer printed circuit board can form a layer of high dielectric dissipation solder resist ink on the open stub of the via, dissipating the high frequency signals entering the open stub, reducing the rebounding of high frequency signals, and improving the transmission quality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multilayer printed circuit board comprising:
   a first outer circuit layer comprising a first trace configured to transmit a high frequency signal;
   an inner circuit layer comprising a second trace, wherein the first outer circuit layer is formed at one side of the inner circuit layer;
   a second outer circuit layer formed at another side of the inner circuit layer;
   a via formed from the first outer circuit layer to the second outer circuit layer, and coupled to the first trace and the second trace, wherein the second trace is coupled to the first trace through the via for transmitting the high frequency signal;

a layer of high dielectric dissipation solder resist ink formed on a terminal of an open stub of the via exposed outside of the second outer circuit layer; and a layer of low dielectric dissipation solder resist ink covering the second outer circuit layer and the layer of high dielectric dissipation solder resist ink.

2. The multilayer printed circuit board of claim 1, wherein corresponding to a high frequency, a dissipation factor of the layer of high dielectric dissipation solder resist ink is substantially a hundred times a dissipation factor of the layer of low dielectric dissipation solder resist ink.

3. The multilayer printed circuit board of claim 1, wherein a thickness of the layer of high dielectric dissipation solder resist ink is greater than 1 mil.

4. The multilayer printed circuit board of claim 1, wherein corresponding to a high frequency, a dielectric constant of the layer of high dielectric dissipation solder resist ink is substantially greater than 100.

* * * * *